(12) United States Patent
Kim et al.

(10) Patent No.: US 7,765,074 B2
(45) Date of Patent: Jul. 27, 2010

(54) CIRCUIT, APPARATUS AND METHOD FOR CAPTURING A REPRESENTATION OF A WAVEFORM FROM A CLOCK-DATA RECOVERY (CDR) UNIT

(75) Inventors: Dennis Kim, San Francisco, CA (US); Jared Zerbe, Woodside, CA (US); Mark Horowitz, Menlo Park, CA (US); William Stonecypher, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/445,702

(22) Filed: Jun. 2, 2006

(65) Prior Publication Data

US 2006/0224339 A1    Oct. 5, 2006

Related U.S. Application Data

(63) Continuation of application No. 10/429,514, filed on May 5, 2003, now Pat. No. 7,076,377.

(60) Provisional application No. 60/446,467, filed on Feb. 11, 2003.

(51) Int. Cl.
*G06F 19/00* (2006.01)
(52) U.S. Cl. .................... 702/66; 375/355
(58) Field of Classification Search .............. 702/66, 702/79, 90, 189, 124–125, 176–178; 375/355, 375/371, 373, 375–376; 370/276, 360, 364–365, 370/442, 503, 516; 360/27, 48, 51; 341/100
See application file for complete search history.

(56) References Cited

U.S. PATENT DOCUMENTS

| 3,869,580 | A | 3/1975 | Ragsdale | 179/15 |
|---|---|---|---|---|
| 3,909,563 | A | 9/1975 | Ghosh | 179/175 |
| 4,271,514 | A | 6/1981 | Parras | 371/22 |
| 4,475,210 | A | 10/1984 | Couch | 375/10 |
| 4,727,540 | A | 2/1988 | Lacroix | 370/110.1 |

(Continued)

FOREIGN PATENT DOCUMENTS

| EP | 0333942 A1 | 9/1989 |
|---|---|---|
| EP | 1134668 A2 | 9/2001 |
| JP | 4147071 A2 | 5/1992 |
| JP | 4246921 A2 | 9/1992 |
| JP | 2000035831 A2 | 2/2000 |

OTHER PUBLICATIONS

Maxfield, C., "The Ouroboros of the Digital Consciousness: Linear-FeedbackShift Registers," EDN, pp. 135-142, Jan. 4, 1996.

(Continued)

*Primary Examiner*—Hal D Wachsman
*Assistant Examiner*—Mary C Baran
(74) *Attorney, Agent, or Firm*—Vierra Magen Marcus & DeNiro LLP

(57) ABSTRACT

A circuit, apparatus and method obtains system margin at the receive circuit using phase shifted data sampling clocks while allowing the CDR to remain synchronized with the incoming data stream in embodiments. In an embodiment, a circuit includes first and second samplers to sample a data signal and output data and edge information in response to a data clock signal and an edge clock signal. A phase detector generates phase information in response to the data information and the edge information. A clock phase adjustment circuit generates the data clock signal and the edge clock signal in response to the data information during a synchronization mode. The clock phase adjustment circuit increments a phase of the data clock signal during a waveform capture mode.

20 Claims, 9 Drawing Sheets

U.S. PATENT DOCUMENTS

| | | | | |
|---|---|---|---|---|
| 5,142,495 | A | 8/1992 | Canepa | 365/189.09 |
| 5,197,062 | A | 3/1993 | Picklesimer | 370/13 |
| 5,228,042 | A | 7/1993 | Gauthier et al. | 371/20.05 |
| 5,258,986 | A | 11/1993 | Zerbe | 371/21.2 |
| 5,265,089 | A | 11/1993 | Yonehara | 370/15 |
| 5,369,755 | A | 11/1994 | Berkovich | 375/500 |
| 5,383,177 | A | 1/1995 | Tateishi | 370/15 |
| 5,392,298 | A | 2/1995 | Shinjo | 371/25.1 |
| 5,412,665 | A | 5/1995 | Gruodis | 371/27 |
| 5,430,736 | A | 7/1995 | Takeoka | 371/23 |
| 5,444,715 | A | 8/1995 | Gruetzner | 371/22.3 |
| 5,473,619 | A | 12/1995 | Sakaguchi | 371/25.1 |
| 5,483,676 | A | 1/1996 | Mahany | 455/67.4 |
| 5,485,473 | A | 1/1996 | Diebold | 371/22.1 |
| 5,490,150 | A | 2/1996 | Andrews | 371/20.1 |
| 5,519,719 | A | 5/1996 | Elpers | 371/27 |
| 5,675,588 | A | 10/1997 | Maruyama et al. | 371/20.4 |
| 5,732,089 | A | 3/1998 | Negi | 371/5.1 |
| 5,742,798 | A | 4/1998 | Goldrian | 395/551 |
| 5,761,212 | A | 6/1998 | Foland, Jr. | 371/21.2 |
| 5,761,216 | A | 6/1998 | Sotome | 371/27.1 |
| 5,790,523 | A | 8/1998 | Ritchie, Jr. | 370/241 |
| 5,802,073 | A | 9/1998 | Platt | 371/22.5 |
| 5,812,619 | A * | 9/1998 | Runaldue | 375/376 |
| 5,815,017 | A | 9/1998 | McFarland | 327/158 |
| 5,831,996 | A | 11/1998 | Abramovici | 371/27.1 |
| 5,841,271 | A | 11/1998 | Nakayama | 323/316 |
| 5,875,177 | A | 2/1999 | Uriu et al. | 370/244 |
| 5,917,856 | A | 6/1999 | Torsti | 375/231 |
| 5,938,784 | A | 8/1999 | Kim | 714/733 |
| 5,999,022 | A | 12/1999 | Iwata | 327/112 |
| 6,003,118 | A | 12/1999 | Chen | 711/167 |
| 6,005,632 | A | 12/1999 | Cahill, III | 348/645 |
| 6,055,297 | A | 4/2000 | Terry | 379/1 |
| 6,061,817 | A | 5/2000 | Jones | 714/738 |
| 6,073,263 | A | 6/2000 | Arkin | 714/738 |
| 6,154,659 | A | 11/2000 | Jalali | 455/522 |
| 6,160,790 | A | 12/2000 | Bremer | 310/201 |
| 6,160,860 | A * | 12/2000 | Larsson | 375/376 |
| 6,201,829 | B1 | 3/2001 | Schneider | 375/221 |
| 6,222,380 | B1 | 4/2001 | Gerowitz et al. | 326/38 |
| 6,230,022 | B1 | 5/2001 | Sakoda | 455/522 |
| 6,289,045 | B1 | 9/2001 | Hasegawa et al. | 375/231 |
| 6,292,116 | B1 | 9/2001 | Wang | 341/100 |
| 6,326,852 | B1 | 12/2001 | Wakayama | 331/17 |
| 6,331,787 | B1 | 12/2001 | Whitworth et al. | 326/30 |
| 6,339,387 | B1 | 1/2002 | Koga | 341/100 |
| 6,378,079 | B1 | 4/2002 | Mullarkey | 713/401 |
| 6,385,236 | B1 | 5/2002 | Chen | 375/224 |
| 6,407,572 | B1 | 6/2002 | Kanase | 324/765 |
| 6,421,801 | B1 | 7/2002 | Maddux | 714/744 |
| 6,438,159 | B1 | 8/2002 | Uber | 375/225 |
| 6,463,109 | B1 * | 10/2002 | McCormack et al. | 375/355 |
| 6,473,871 | B1 | 10/2002 | Coyle | 714/715 |
| 6,477,674 | B1 | 11/2002 | Bates | 714/738 |
| 6,574,758 | B1 | 6/2003 | Eccles | 714/712 |
| 6,606,041 | B1 | 8/2003 | Johnson | 341/120 |
| 6,611,928 | B1 | 8/2003 | Fujiyoshi | 714/715 |
| 6,615,148 | B2 * | 9/2003 | Pickerd | 702/66 |
| 6,625,764 | B1 | 9/2003 | Dawson | 714/715 |
| 6,628,621 | B1 | 9/2003 | Appleton | 370/249 |
| 6,631,486 | B1 | 10/2003 | Komatsu | 714/724 |
| 6,650,698 | B1 | 11/2003 | Liau | 375/229 |
| 6,671,847 | B1 | 12/2003 | Chao et al. | 714/744 |
| 6,674,998 | B2 | 1/2004 | Prentice | 455/114.2 |
| 6,684,350 | B1 | 1/2004 | Theodoras, II | 714/712 |
| 6,684,351 | B1 | 1/2004 | Bendak | 714/715 |
| 6,693,881 | B1 | 2/2004 | Huysmans et al. | 370/236.1 |
| 6,694,466 | B1 | 2/2004 | Tsai | 714/729 |
| 6,977,959 | B2 * | 12/2005 | Brunn et al. | 375/219 |
| 2001/0016929 | A1 | 8/2001 | Bonneau et al. | 714/735 |
| 2001/0021987 | A1 | 9/2001 | Govindarajan et al. | 714/705 |
| 2001/0034866 | A1 | 10/2001 | Barry | 714/734 |
| 2002/0059545 | A1 | 5/2002 | Nakashima | 714/43 |
| 2002/0059546 | A1 | 5/2002 | Yonetoku | 714/738 |
| 2002/0073373 | A1 | 6/2002 | Nakao | 714/738 |
| 2002/0108079 | A1 | 8/2002 | Takahashi | 714/738 |
| 2002/0138800 | A1 | 9/2002 | Kim | 714/719 |
| 2002/0146084 | A1 * | 10/2002 | Cranford et al. | 375/360 |
| 2002/0178412 | A1 | 11/2002 | Matsui | 714/718 |
| 2003/0065995 | A1 | 4/2003 | Barrett | 714/715 |
| 2003/0070118 | A1 | 4/2003 | Nakao | 714/30 |
| 2003/0086517 | A1 | 5/2003 | Vallet | 375/355 |
| 2003/0088818 | A1 | 5/2003 | Manning | 714/724 |
| 2003/0131297 | A1 | 7/2003 | Fischel | 714/728 |
| 2004/0114698 | A1 | 6/2004 | Barrett | 375/355 |

OTHER PUBLICATIONS

Dally et al., "Multi-gigabit Signaling with CMOS," DARPA funded.

Cova et al., Characterization of Individual Weights in Transversal Filters and Application to CCD's, IEEE Journal of Solid-State Circuits, vol. SC-17, No. 6, Dec. 1982, pp. 1054-1061.

Farber et al, "Wide-Band Network Characterization by Fourier Transformation of Time-Domain Measurements," IEEE Journal of Solid-State Circuits, vol. SC-4, No. 4, Aug. 1969, pp. 231-235.

Soumyanath, K. et al, "Accurate On-Chip Interconnect Evaluation: A Time-Domain Technique." IEEE Journal of Solid-State Circuits, vol. 34, No. 5, May 1999, pp. 623-631.

Sato, T., et al., "Accurate in Situ Measurement of Peak Noise and Delay Change Induced by Interconnect Coupling," IEEE Journal of Solid-State Circuits, vol. 36, No. 10, Oct. 2001. pp. 1587-1591.

Ikawa, Y. et al, "Modeling of High-Speed, Large-Signal Transistor Switching Transcients from s-Parameter Measurements," IEEE Journal of Solid-State Circuits, vol. SC-17, No. 2, Apr. 1982, pp. 299-305.

Klein, B., "Use LFSRs to Build Fast FPGA-Based Counters," Electronic Design, pp. 87-100, Mar. 21, 1994.

Cypress Semiconductor Corporation, "HOTLink™ Built-In Self-Test (BIST)." Mar. 11, 1999. 13 pages.

Pfaff, A., "Test high-speed drivers with bursts and pseudorandom bit patterns," EDN, pp. 133-136, May 12, 1994 (3 pages).

* cited by examiner

CIRCUIT, APPARATUS AND METHOD FOR CAPTURING A REPRESENTATION OF A WAVEFORM FROM A CLOCK-DATA RECOVERY (CDR) UNIT

PRIORITY CLAIM

This application is a continuation of U.S. patent application Ser. No. 10/429,514 filed May 5, 2003, now U.S. Pat. No. 7,076,377 which application claims priority to U.S. Provisional Patent Application Ser. No. 60/446,467 filed Feb. 11, 2003.

RELATED APPLICATIONS

U.S. patent application Ser. No. 09/776,550 entitled "Method and Apparatus for Evaluating and Calibrating a Signal System", inventors Jared Zerbe, Pak Chau, and William F. Stonecypher, filed Feb. 2, 2001, incorporated by reference herein.

FIELD OF THE INVENTION

The present invention relates to communication systems, and in particular, serial link systems.

BACKGROUND OF INVENTION

A serial data system consists of a transmit circuit for transmitting data bits on a serial link to a receive circuit. Most receive circuits include a Clock-Data Recovery ("CDR") circuit to synchronize the receive sampling clock with the incoming serial data. A CDR actively looks for transitions in the incoming serial data stream and phase aligns sampling clock edges with respect to the incoming data transitions to provide maximum setup-hold timing margins.

An objective of a receive circuit in a serial link system is to capture the incoming data stream without any errors. In a synchronous system, the incoming data can be broken up into discrete bits with respect to time (see 'din' in FIG. 2) with each bit contained within the same period (i.e. bit time). To receive the data in an accurate manner, it is desirable to sample each data bit in the center of each bit's respective bit time. These sample points can be represented as rising and falling edges from a periodic waveform or clock signal (see 'dClk' in FIG. 2). Assuming that this data sampling clock has the same (or close to the same) transition or bit time as the data (i.e. frequency), a circuit is needed to time or phase shift the edges of the sampling clocks to the center of the data's bit time since this relationship between data and sampling clock edges is unknown. Hence the need for a CDR unit which recovers the sampling clock from the incoming data transitions to place the rising and falling edges of a clock signal in the middle of a bit time. By placing the edges of a clock signal in the middle of a bit time, the maximum amount of timing margin (or setup/hold margin) is developed for each bit and a CDR is considered 'phase locked' to the incoming data.

At the same time, the receive circuit may also have a circuit to provide a Built-in-Self-Test ("BIST") as described in the above-referenced patent application. A BIST circuit may sample the serial data in order to obtain representations of incoming signals or waveforms for system margining purposes. The timing requirements, however, of the sampling clock edges for obtaining waveforms by a BIST circuit conflict with the timing requirements to synchronize the clock edges with the incoming serial data.

To perform a system margining test as described in the related patent application, it may be necessary to phase shift the sampling clock edges with respect to the received data stream. However, as the sampling clock is shifted off the 'phase locked' position, the CDR loop will not get the proper phase information from the data samples leading to erroneous tracking information for the receive circuit.

Therefore, it is desirable to provide a circuit, an apparatus and a method that can synchronize the sampling clock edges with the incoming serial data while at the same time capture representations of waveforms of the incoming serial data. In particular, it is desirable to provide methods with different circuits and setups to allow a CDR to track relative to the incoming data stream; while at the same time allow system margining to take place in the receive circuit.

SUMMARY OF INVENTION

Embodiments of the present invention enable obtaining system margin at the receive circuit using phase shifted data sampling clock signals while allowing the CDR to remain synchronized with the incoming data stream. In a first embodiment of the present invention, logic is provided in a CDR unit of a serial receiving circuit by disengaging or freezing the CDR loop during a waveform capture mode. In a second embodiment of the present invention, an additional clock phase adjuster and sampling stage is used to generate offset clock signals independent of CDR sampling clocks. In a third embodiment of the present invention, edge clocks alone are used for CDR tracking of half rate serial data while data clocks are used for capturing a waveform. In a fourth embodiment of the present invention, a predetermined pattern having a single transition is used for CDR tracking. In a fifth embodiment of the present invention, a predetermined pattern is used for capturing a waveform in a first period of time and data for synchronization is used for CDR tracking during a second period of time. In a sixth embodiment of the present invention, a circuit includes multiple serial links to receive different sets of serial data where the master link is coupled to an active CDR for tracking. Other slave links also receive serial data and can be used for capturing representation of waveforms while CDR tracking information is derived from one master link.

In a first embodiment of the present invention, logic is provided in a phase adjustment circuit of the CDR unit of a serial receiving circuit for disengaging or freezing the CDR loop during system margining. In this embodiment, the loop will not track the incoming data transitions allowing system margining to occur by phase shifting the data clock signals in response to a Hold signal. Alternatively, the incoming data stream could be offset while the data clocks are held fixed.

In a second embodiment of the present invention, an additional phase adjuster and sampling stage is used to generate offset clock signals independent of CDR tracking clocks. In this embodiment of the present invention, the main CDR loop remains unchanged, so the loop continues to track the incoming serial data while system margining clocks that are phase shifted off the main CDR tracking clocks are controlled by the additional phase adjuster and data sampling stage.

In a third embodiment of the present invention, edge clocks alone are used for CDR tracking of half rate serial data while data clocks are used for capturing system margining information. In this embodiment of the present invention, an additional waveform select logic stage is provided after a sampler stage to switch from the normal full rate mode of operation for CDR tracking. The CDR is still tracking the half-rate data by using only the edge clock while the data clock can be shifted for system margining purposes.

In a fourth embodiment of the present invention, a predetermined sequence of serial data having a single transition is used for CDR tracking. During system margining, a specific periodic pattern is often transmitted in order to observe the system response to a periodic stimulus. The predetermined sequence having one transition is substituted into the CDR phase detect path in place of the incoming periodic pattern to phase track during this mode of operation. Knowing that the incoming pattern is periodic makes this embodiment possible because an apparatus can maintain CDR phase lock to the single transition within the pattern while system margining occurs for the entire data pattern.

In a fifth embodiment of the present invention, a predetermined data pattern is used for capturing a margining waveform in a first period of time and data for synchronization is used for CDR tracking during a second period of time. This embodiment simply switches between tracking and margining modes for different parts of the pattern.

In a sixth embodiment of the present invention, a circuit may include multiple serial links to receive different sets of serial data where the master link is coupled to an active CDR for tracking. Other slave links also receive serial data and can be used for capturing representations of waveforms while CDR tracking information is derived from the first master link. In this embodiment, an apparatus comprises a 'master' transmit circuit that is coupled to a 'master' receive circuit and transmits serial data. The 'master' receive circuit generates the phase adjustment signal in response to the serial data that performs the active CDR tracking. A 'slave' transmit circuit is coupled to a respective receive 'slave' circuit across a serial link and transmits serial data. The 'slave' receive circuit is coupled to the 'master' receive circuit in a way such that the 'slave' receive circuit obtains CDR tracking information from the 'master' receive circuit while independently obtaining a representation of a waveform in response to the receive circuit's independent clock signal.

These embodiments of the present invention, as well as other aspects and advantages, are described in more detail in conjunction with the figures, the detailed description, and the claims that follow.

DETAILED DESCRIPTION

Figure 1:
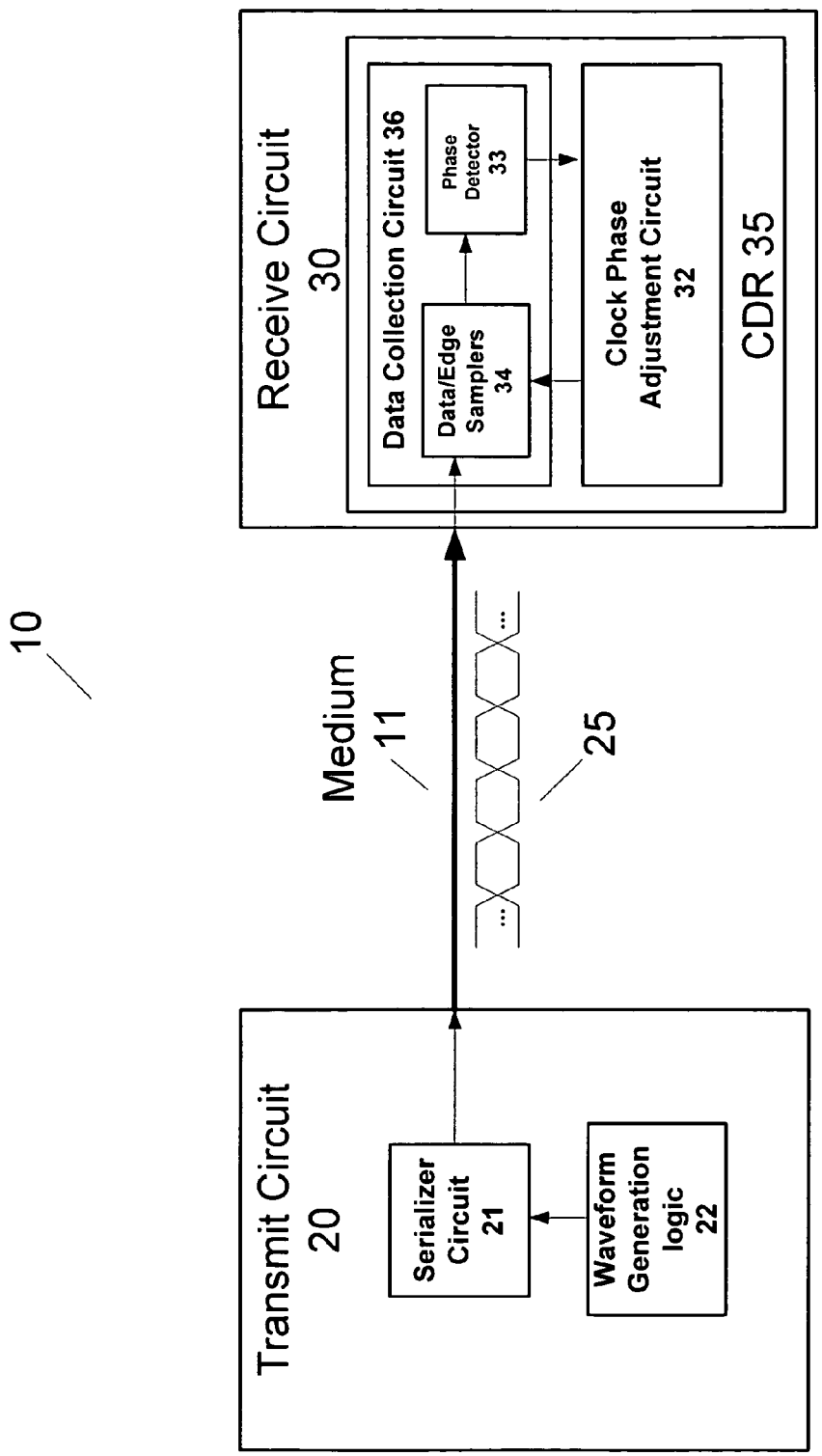
FIG. 1 is a block diagram illustrating a communication system in accordance with an embodiment of the present invention.

FIG. 1 illustrates a communication system 10 according to an embodiment of the present invention. In an embodiment of the present invention, communication system 10 includes a transmit circuit 20 and a receive circuit 30 coupled by medium 11. In an embodiment of the present invention, transmit circuit 20, and in particular serializer circuit 21, generates serial data 25 on medium 11 to receive circuit 30. Transmit circuit 20 also includes waveform generation logic 22 for generating waveform data (a.k.a. "escope" data) or predetermined waveforms as described in United States patent application entitled "Method and Apparatus for Evaluating and Calibrating a Signal System" cited above and incorporated by reference herein in an embodiment of the present invention.

Receive circuit 30 includes a Clock Data Recovery unit ("CDR") 35 that actively looks for transitions in the incoming data stream and phase aligns the sampling clock edges with respect to the incoming data to provide optimal setup/hold margin times. CDR 35 includes Data Collection circuit 36 having data/edge samplers 34 and phase detector 33, as well as Clock Phase Adjustment circuit 32. CDR 35 samples the serial data with data/edge samplers 34. Phase detector 33 then uses the sampled data and edge information to provide early and late phase information about the incoming data relative to the sampling clock signals. Clock Phase Adjustment circuit 32 generates the sampling clock signals that complete the CDR loop in response to phase information from phase detector 33. Embodiments of present invention, including embodiments of CDR 35, are illustrated in FIGS. 3-7 and described below.

In an embodiment of the present invention, medium 11 is a wire or set of wires for transporting signals, such as waveforms. In an embodiment of the present invention, medium 11 is a bidirectional data bus that may carry data information, control information or both. In an alternate embodiment of the present invention, medium 11 is a unidirectional bus. In still a further embodiment of the present invention, medium 11 includes a wireless or photonics connection.

Figure 2:
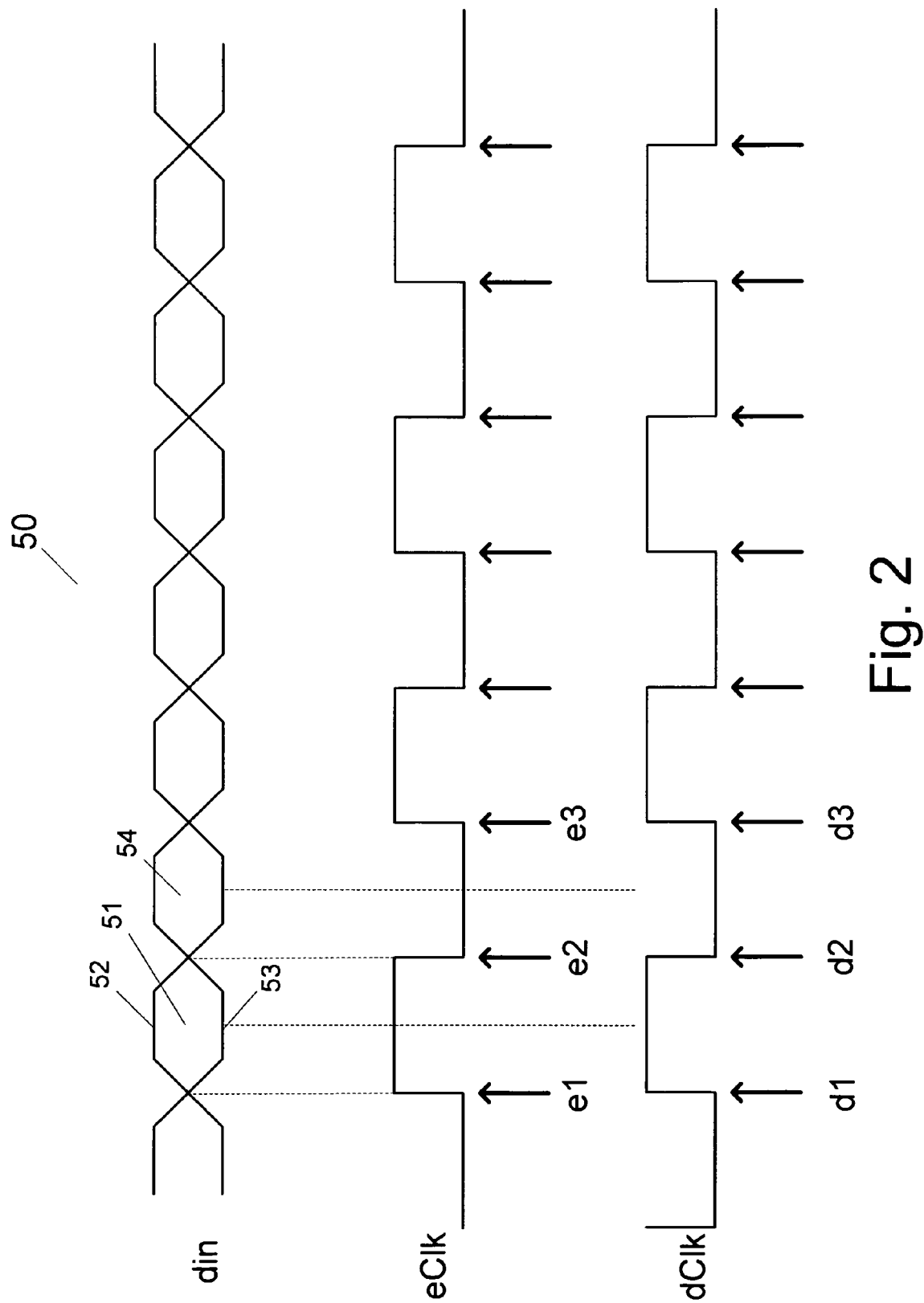
FIG. 2 is a diagram illustrating signals that may be used in accordance with an embodiment of the present invention.

FIG. 2 illustrates serial data and sampling clock signals 50 in accordance with an embodiment of the present invention. Serial data 'din' represents the alternating transitions of serial data that may be transported on medium 11 illustrated in FIG. 1. Data cell 51 represents a period of time in serial data 'din' in which a data value may have a high value 52 or low value 53. Edge clock 'eClk' is used to determine the boundary of data cell 51 or the transition from high to low or from low to high of both the rising (even) and falling (odd) edges. For example, the rising edge e1 and falling edge e2 of edge clock signal 'eClk' are used to define data cell 51. The data clock signal 'dClk' is 90º offset in phase from edge clock 'eClk' and is used to determine the value of a data cell. For example, the data clock 'dClk' rising edge d1 (even) and falling edge d2 (odd) are used to determine the time at which the value of serial data 'din' is sampled. In particular, the time at which to sample serial data 'din' in order to determine the value of data cell 51. Data cell 51 may have a binary one value corresponding to high value 52 or a binary zero value corresponding to low value 53. Likewise, data clock 'dClk' falling edge d2 is used to determine the sampling time associated with data cell 54.

A CDR is typically responsible for generating edge clock 'eClk' and data clocks 'dClk' (both rising and falling transitions used to sample even/odd data) in order to obtain data of serial data 'din'. A CDR is responsible for adjusting or phase shifting edge clock 'eClk' and data clock 'dClk' in order to align transitions of edge clock 'eClk' with the boundaries of data cells within serial data 'din' and align transitions of data clock 'dClk' with the center of the corresponding data cells. These adjusted clock edges are used to time the sampling of serial data 'din'. This synchronization of the data and edge clocks to the incoming serial data 'din' is often carried out by a type of Delay Lock Loop ("DLL") called the CDR loop. However, the clock signals used for synchronization do not allow for sampling a waveform that may be used for evaluating system performance or diagnostics. In order to evaluate system performance, it is desirable to have the ability to sweep sampling clock relative to the received data pattern. However, with the CDR loop still engaged, the loop will attempt to compensate for the data clock 'dClk' disturbance off its ideal 90° phase shifted position and give false phase alignment information out of the phase detector to the sampling clocks relative to the incoming data. This is a problem being addressed by embodiments of the present invention.

Figure 3:
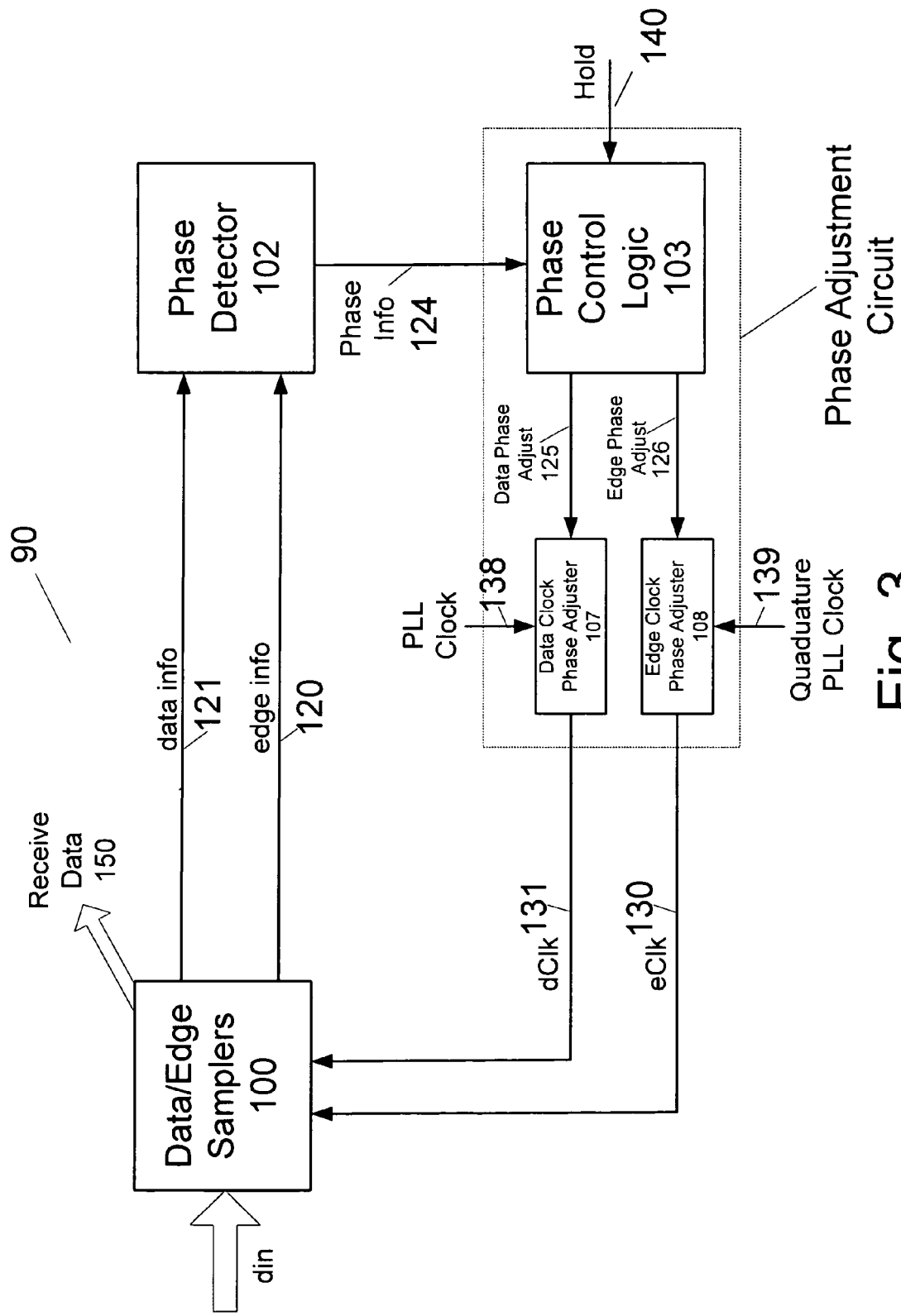
FIG. 3 is a block diagram illustrating a CDR loop with the Hold signal in accordance with an embodiment of the present invention.

An embodiment of a CDR 35 is shown as CDR 90 in FIG. 3. CDR 90 includes data/edge samplers 100 for receiving serial data, 'din', responsive to data and edge sampling clock signals 'dClk' and 'eClk', on lines 131 and 130, respectively. Receive data 150 is collected and sent to an end user or other circuit in an embodiment of the present invention. Collected data information and edge information is then provided to a phase detector 102, on lines 121 and 120, respectively. Phase detector 102 measures the phase difference between the sampling clock signals and incoming serial data, and outputs phase information on line 124. Phase control logic 103 then decodes the phase difference information and provides phase adjust signals, in particular a data phase adjust signal and an edge phase adjust signal on lines 125 and 126, respectively. In an embodiment of the present invention, receive circuit 30 includes a quadrature clock that is locked to a reference (typically done with a PLL) in order to provide a PLL clock signal and quadrature PLL clock signal. A data clock phase adjuster 107 shifts the phase of data sampling clock, 'dClk', in response to the data phase adjust signal and a PLL clock signal on line 138. Likewise, edge clock phase adjuster 108 shifts the phase of the edge clock, 'eClk', in response to the edge phase adjust signal and a quadrature PLL clock signal on line 139. Data and edge sampling clock signals, 'dClk' and 'eClk', for both data and edge then are fed back to data/edge samplers 100 to complete a CDR 90 loop.

FIG. 3 also illustrates a CDR 90 that both synchronizes the sampling clock signals to the serial data 'din' and also captures a representation of a waveform in the serial data 'din' by asserting the 'Hold' signal on line 140 in an embodiment of the present invention. Generally, asserting a 'Hold' signal to phase control logic 103 during a waveform capture mode disengages the CDR loop and enables an asserted 'Offset_En' signal to allow the phase sweep of the data clock signal 'dClk' to sample the serial data 'din' at different points in time. Phase control logic 103 ignores the phase alignment information signals on line 124 from phase detector 102 that are based on offset phase shifted data clock signal 'dClk' into data/edge samplers 100.

Serial data 'din' is provided to data/edge samplers 100 as illustrated in FIG. 3. In an embodiment of the present invention, edge samples or values are obtained from an edge sampling circuit (i.e. data/edge samplers 100) in response to the rising and falling edges of edge clock signal 'eClk' on line 130 illustrated in FIG. 3. Likewise, data samples or values of a data cell are obtained from a data sampling circuit (i.e. data/edge samplers 100) in response to the rising and falling edges of data clock signal 'dClk' on line 131 illustrated in FIG. 3. Edge clock signal 'eClk' and data clock signal 'dClk' are input to data/edge samplers 100 from clock phase adjuster 108 and 107, respectively. Data information and edge information are transferred to phase detector 102 via lines 121 and 120, respectively. Phase detector 102 determines, based on a plurality of data and edge values, whether the edge clock signal is early or late and should be shifted or aligned up or down with respect to serial data 'din'; for example, whether edge clock e1 should be shifted left or right to align with the beginning of data cell 51 illustrated in FIG. 2. If the transitions of the captured serial data indicate an early transition, an up signal is generated on line 124. If the transitions indicate a late transition, a down signal is generated on line 124.

Phase control logic 103 generates control signals for capturing a representation of a waveform from serial data 'din', and in particular sweeping data clock 'dclk' across a period of a waveform. Phase control logic ignores the phase information signal on line 124 in response to an assertion of a 'Hold' signal on line 140 and 'Offset_En' signal provides control of 'dClk' offset to an external source.

The 'Hold' CDR embodiment described above provides several advantages over the other embodiments provide herein. First, the 'Hold' CDR embodiment requires less additional hardware compared to the other embodiments. Phase control logic 103 includes the necessary logic to respond to an assertion of a 'Hold' and 'Offset_En' signal, but there is no additional data path for the waveform data. Nevertheless, timing errors may be introduced during a capturing of a waveform because a CDR loop is disengaged and cannot track and eliminate errors due to variations in temperature and voltage that can skew clock edges with respect to serial data.

Figure 4:
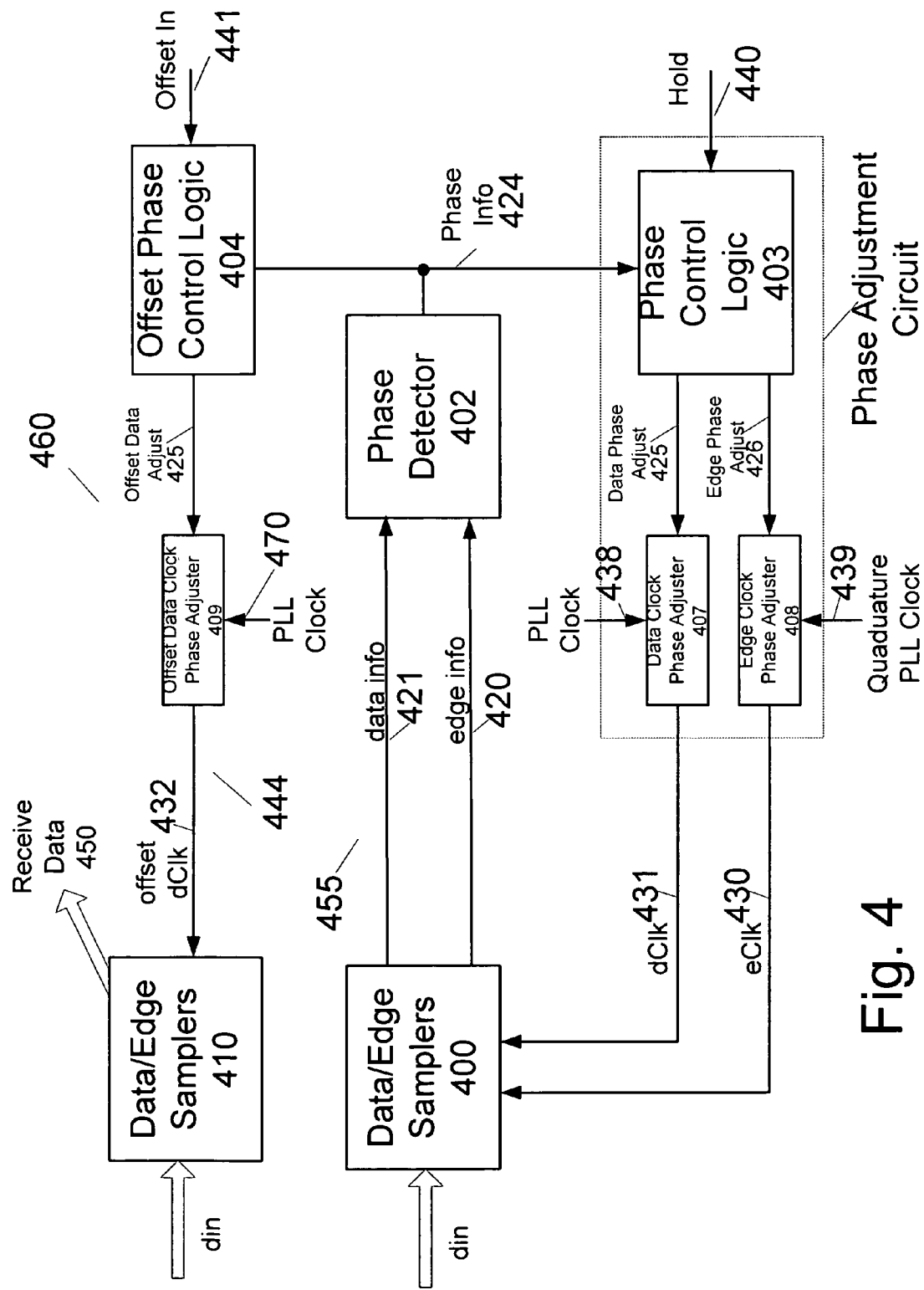
FIG. 4 is a block diagram illustrating an additional sampler and phase adjuster stage in accordance with an embodiment of the present invention.

The components illustrated in FIG. 4 are similar to the components illustrated in FIG. 3. However, FIG. 4 illustrates an additional sampler and phase adjuster or waveform path 444 for providing representations of waveforms and CDR path 455 for synchronizing incoming serial data.

Serial data 'din' is input to data/edge samplers 400. Data clock signal dClk and edge clock signal eClk are input to data/edge samplers 400 on lines 431 and 430, respectively. Data information and edge information is passed to phase detector 402 on lines 421 and 420, respectively.

Phase information is generated on line 424 to phase control logic 403 and offset phase control logic 404. Phase control logic 403 is coupled to phase adjusters 407 and 408 via lines 425 and 426. Edge clock signal 'eClk' is output on line 430 from edge phase adjuster 408; while, data clock signal 'dClk' is output from data phase adjuster 407. A PLL clock signal is provided to phase adjuster 407 on line 438. A quadrature PLL clock signal is provided to phase adjuster 408 on line 439.

An independent waveform data path 444 is used to obtain a representation of a waveform by the offsetting clock signals generated by offset phase control logic 404. Serial data 'din' is input to data/edge samplers 410. Offset data clock signal 'dClk' is input to data/edge samplers 410 on line 432. Offset data clock phase adjuster 409 generates offset data clock signal 'dClk' in response to an offset data adjust signal on line 425 and a PLL clock signal on line 470. Waveform information that would be used for system margining purposes is output as receive data 450.

Offset data adjust signal on line 425 is enabled by 'Offset In' signal asserted on line 441. Offset phase control logic 404 functions similar to phase control logic 103 described in the previous embodiment. But in this embodiment, the offset control logic will use tracking information from the CDR loop path before injecting offset into waveform path 444.

The additional waveform and CDR path embodiment described above provides several advantages over the other embodiments provided herein. First, a CDR path is independent of a waveform data path so a CDR loop can continue to track incoming serial data 'din' as waveform data clock, 'dClk'; sweeps a period of a waveform. However, this embodiment requires additional hardware stages to implement: data/edge samplers 410, offset data clock phase adjuster 409, and offset phase control logic 404.

Figure 5:
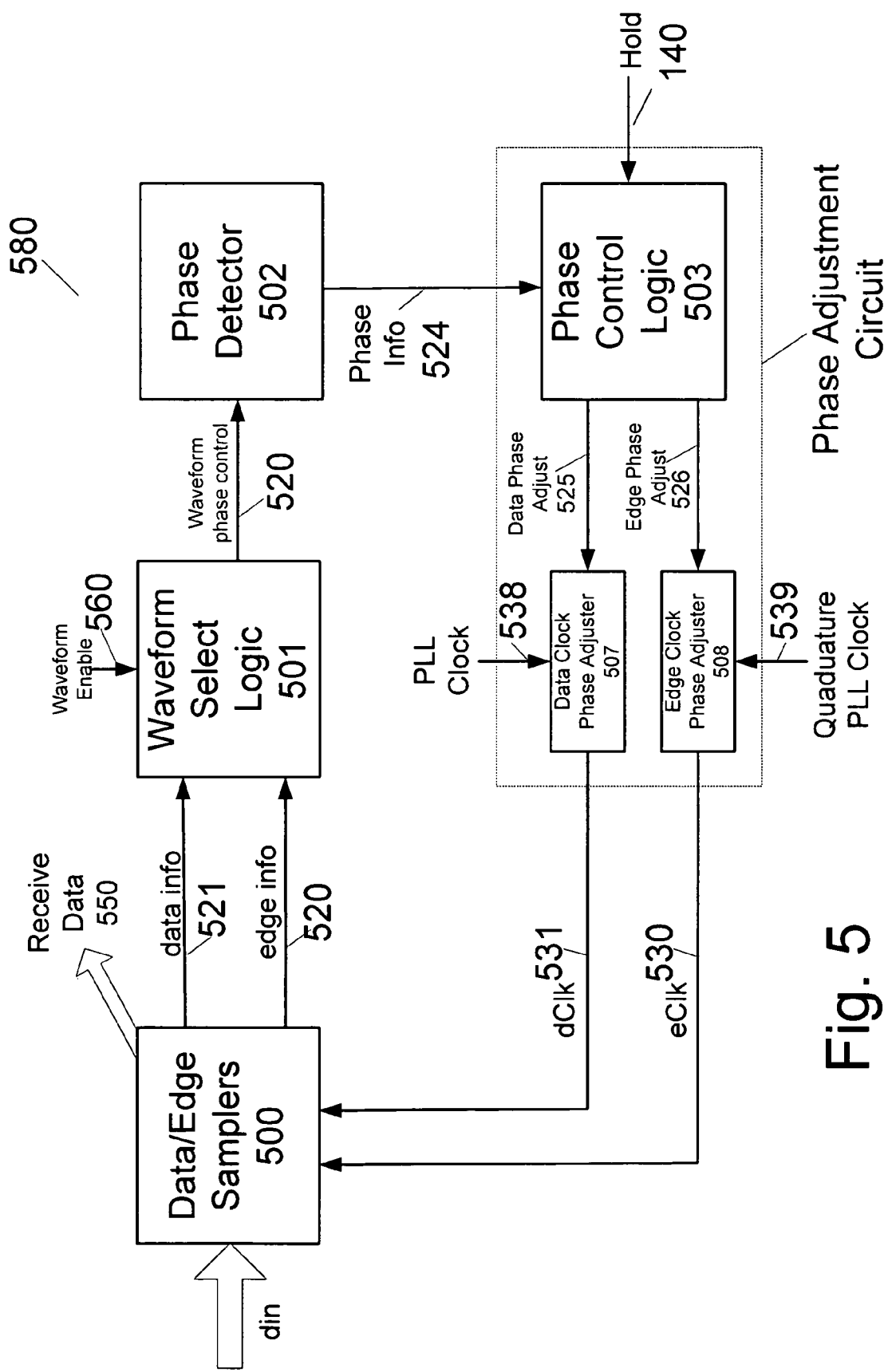
FIG. 5 is a block diagram illustrating the use of edge clock signals for CDR tracking and data clocks for obtaining a representation of waveform in accordance with an embodiment of the present invention.

FIG. 5 illustrates using edge clock signal 'eClk' for CDR tracking while using data clock signal 'dClk' for obtaining a representation of a waveform in an embodiment of the present invention. Edge clock signal 'eClk' is used in tracking CDR loop 580 and requires receiving 'din' at half the typical rate in an embodiment of the present invention. In a waveform capture mode, information from the data clock signals is ignored because data clock signals 'dClk' are offset from a bit sync position and are used for sweeping across a waveform. Edge clocks are used to obtain psuedo (half-rate) data information for CDR tracking.

Figure 6:
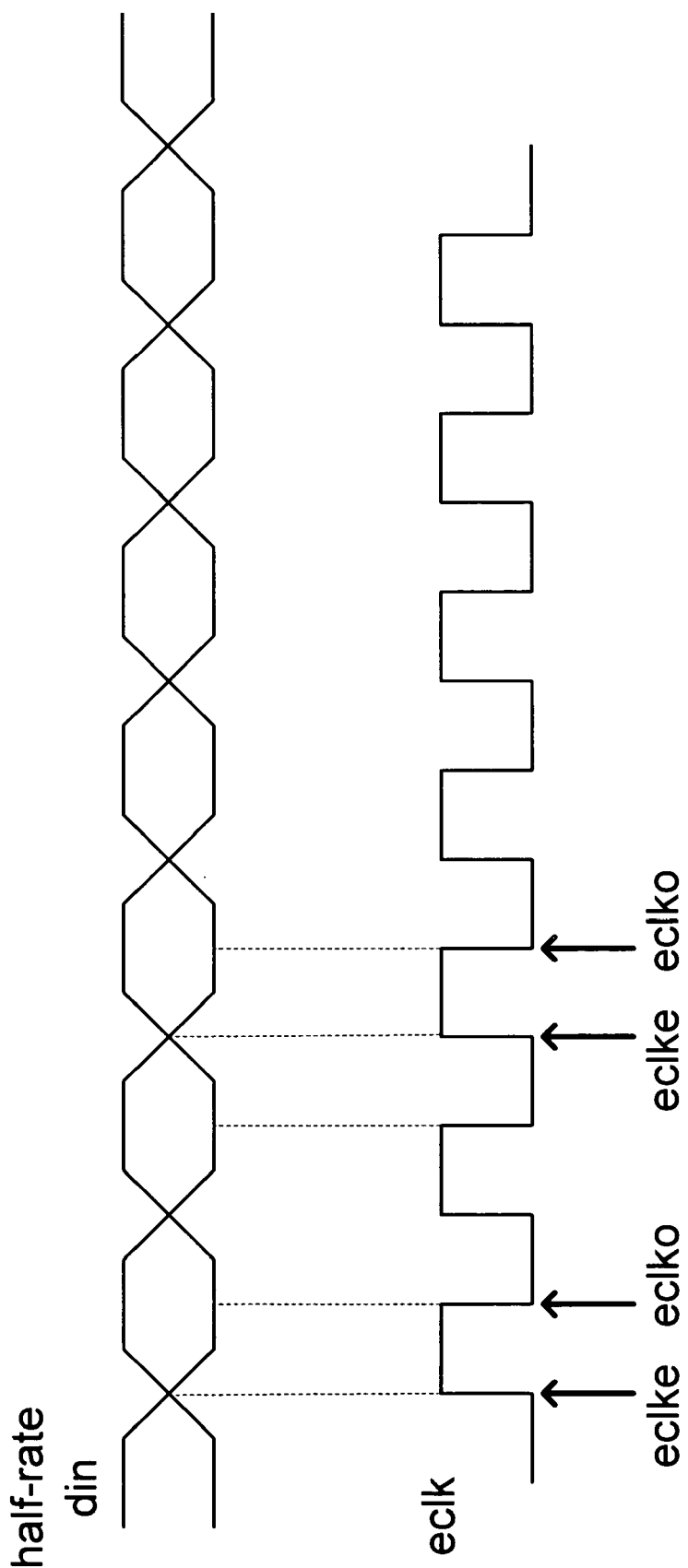
FIG. 6 is a diagram illustrating half-rate serial data and edge sampling clock signals in accordance with an embodiment of the present invention.

FIG. 6 illustrates a half rate serial data 'din' and the use of full-rate edge clocks. In particular, even edge clock signals 'eclke' are used for obtaining edge information and odd edge clock signals 'eclko' are used for obtaining psuedo (half-rate) data information.

Returning to FIG. 5, half-rate 'din' is input to data/edge samplers 500. Edge clock signal 'eClk' is also input on line 530. Likewise, data clock signal 'dClk' is input on line 531. Edge information is output on line 520 and data information is output on line 521.

CDR data and edge information feeds a waveform select logic 501 that is coupled to data/edge samplers 500. Waveform select logic 503 passes edge information responsive to an assertion of a waveform enable signal on line 560 and ignores data information. Phase detector 502 is coupled to waveform select logic 501 via line 520 and operates similarly to phase detector 402 described above. Phase control logic 503 is coupled to phase detector 502 via line 524 and receives phase information. Phase control logic 503 operates similarly to phase control logic 103 illustrated in FIG. 3. Phase control logic 503 is coupled to data and edge phase adjusters 507 and 508, respectively.

Edge clock phase adjuster 508 is coupled to phase control logic 503 via line 526. Data clock phase adjuster 507 is coupled to phase control logic 503 via line 525. Edge clock phase adjuster 508 outputs edge clock signal 'eClk' on lines 530 responsive to an edge phase adjust signal on line 526 and a quadrature PLL clock signal on line 539. Likewise, data clock phase adjuster 507 outputs data clock signal 'dClk' on line 531 responsive to a data phase adjust signal on line 525 and a PLL clock signal on line 538.

In an embodiment of the present invention, a predetermined bit pattern is transmitted repeatedly during a waveform capture mode. For example, an N-bit pattern is transmitted in serial data 'din' to data/edge samplers 500 shown in FIG. 5. By selecting a predetermined bit pattern with at least a single transition, the CDR loop locks to the one transition within the pattern when capturing a representation of a waveform during a waveform capture mode. Waveform select logic 503 selects a predetermined N-bit pattern every M number of cycles for CDR tracking in an embodiment of the present invention. Edge information obtained by using edge clock signal 'eClk' is still used for CDR tracking during a waveform capture mode. During the other non-used cycles of operation, a no transition data pattern would be used which essentially discontinues phase adjustment signal from phase detector 502. Since the data information is not used for CDR tracking with the assertion of waveform enable signal on line 560, the data receive path is free to collect 'escope' waveform data by sweeping the data clock signal 'dClk' across the repeating N-bit data pattern.

The use of a predetermined bit pattern described above offers several advantages over other embodiments of the present invention. First, minimal hardware change is needed when adding waveform select logic 501. Second, since it is known that a predetermined data pattern is transmitted during a waveform capture mode, the CDR can track this pattern by looking for only one transition. However, this embodiment of the present invention updates sampling clock signals at a slower rate compared to other embodiments of the present invention. Phase detect transition updates every N-bits instead of every real transition in normal modes of operation.

Figure 7:
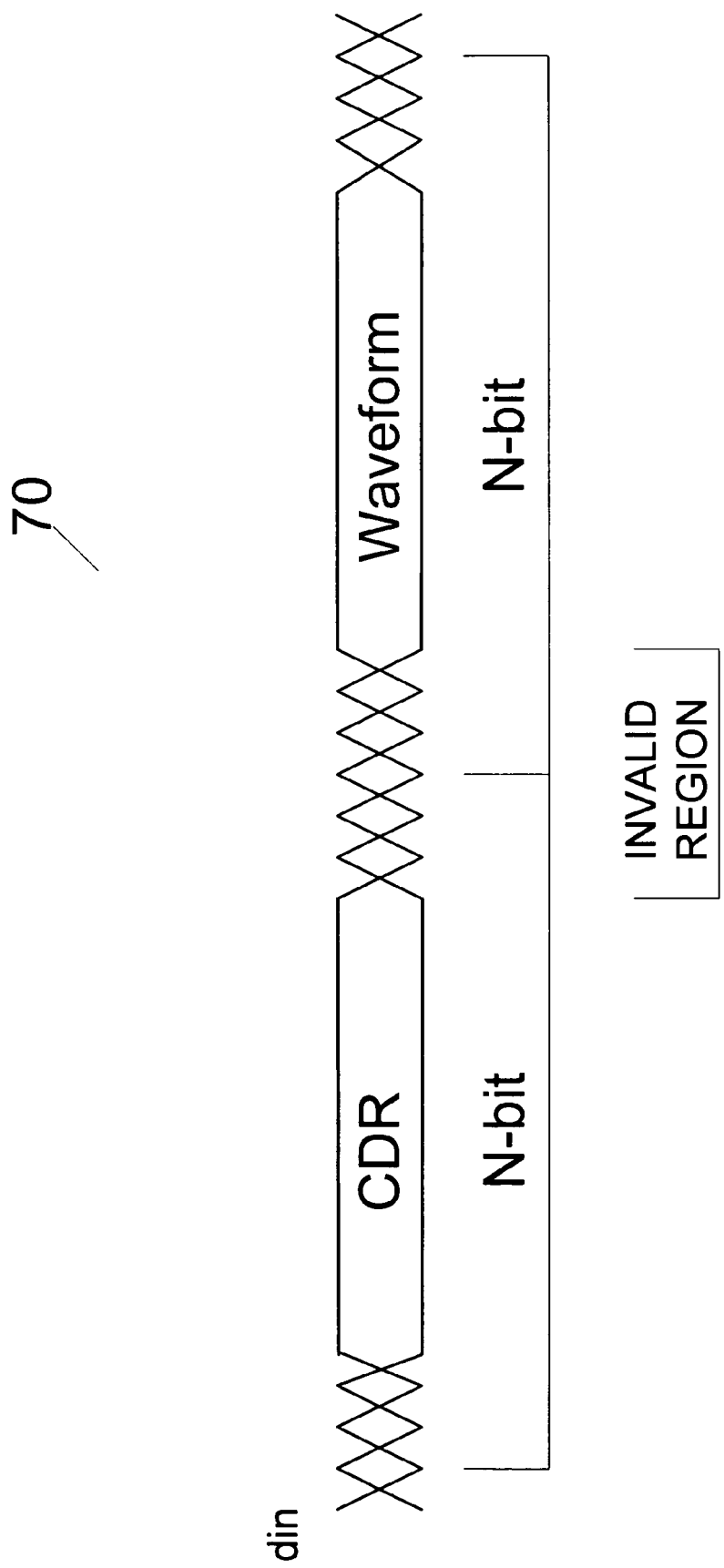
FIG. 7 is a diagram illustrating a use of a waveform pattern in different periods of time to collect CDR tracking information and waveform representations in accordance with an embodiment of the present invention.

FIG. 7 illustrates the use of a predetermined waveform bit pattern to perform waveform data sweeps at a first period of time and then CDR data tracking for synchronization at a second period of time according to an embodiment of the present invention. In this embodiment, a switch is provided in waveform select logic 503 of FIG. 5. The switch toggles between CDR tracking and obtaining a representation of a waveform in response to a waveform enable signal on line 560. Serial data 'din' includes N-bits of CDR data during a first period of time followed by N-bits of waveform data during a second period of time as illustrated in FIG. 7. There is an invalid region between CDR tracking data and waveform data. Obtaining a representation of a waveform and CDR tracking would be alternated in a continuous manner.

Figure 8:
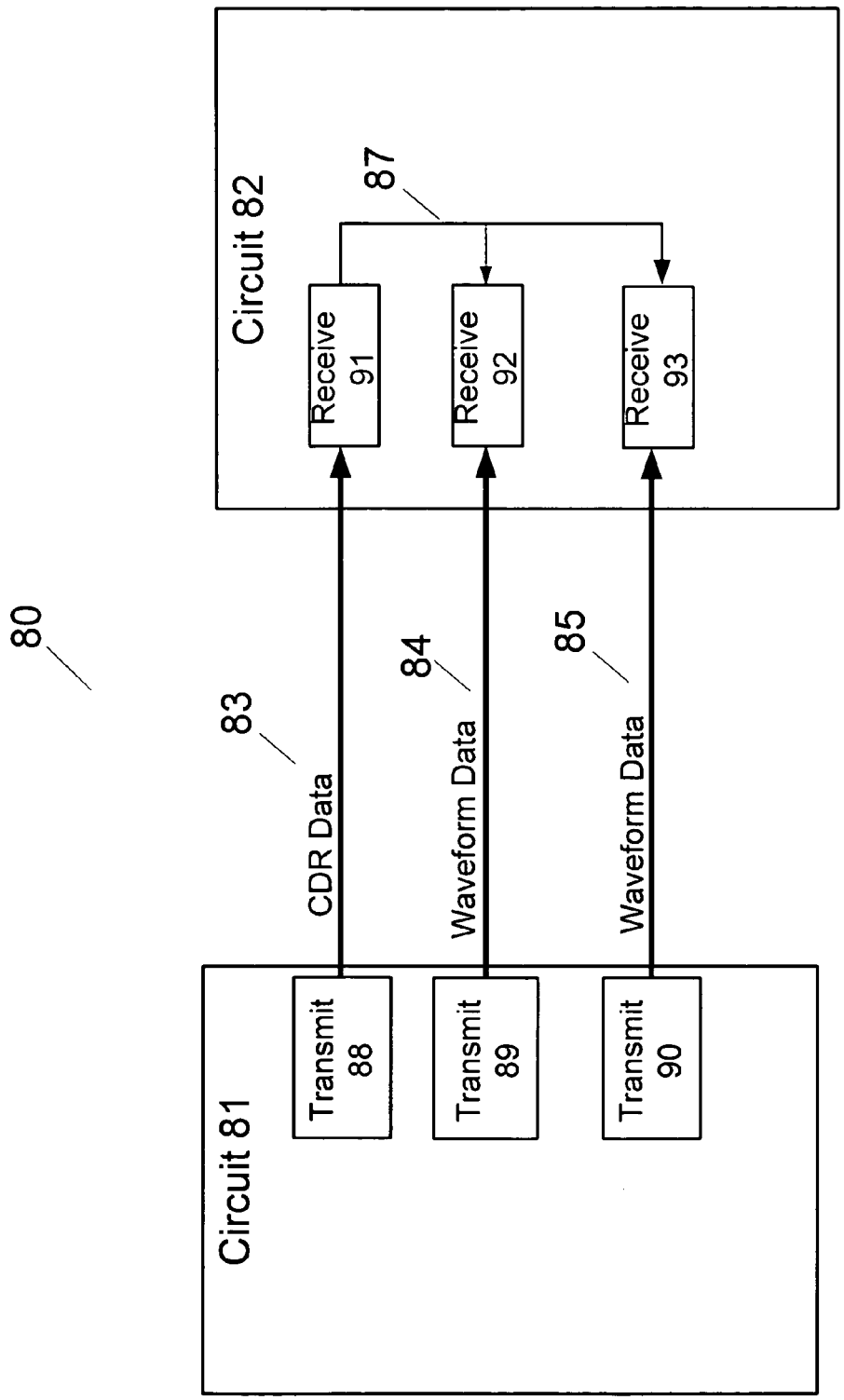
FIG. 8 is a block diagram illustrating multiple serial links in a 'master'/'slave' CDR tracking configuration in accordance with an embodiment of the present invention.

FIG. 8 illustrates a multiple links embodiment of the present invention. Circuit 81 is coupled by multiple links to circuit 82 on a semiconductor substrate 80 in an embodiment of the present invention. In particular, transmit circuits 88, 89, and 90 are coupled to receive circuits 91, 92 and 93 via links or medium 83, 84 and 85, respectfully. Transmit circuit 88, link 83 and receive circuit 91 serve as a 'master' link that performs CDR tracking. Receive circuit 91 generates the synchronous clocking signal to receive circuits 92 and 93 via interconnect 87. Accordingly, slave receive circuits 92 and 93 can obtain representations of waveforms by sweeping the clock signal obtained from receive circuit 91 across a period of a received signal.

The master/slave embodiment offers the advantage of a relatively simple implementation compared to the other embodiments. However, variations across semiconductor substrate 80 cause differences in optimum sampling for the different links.

Figure 9:
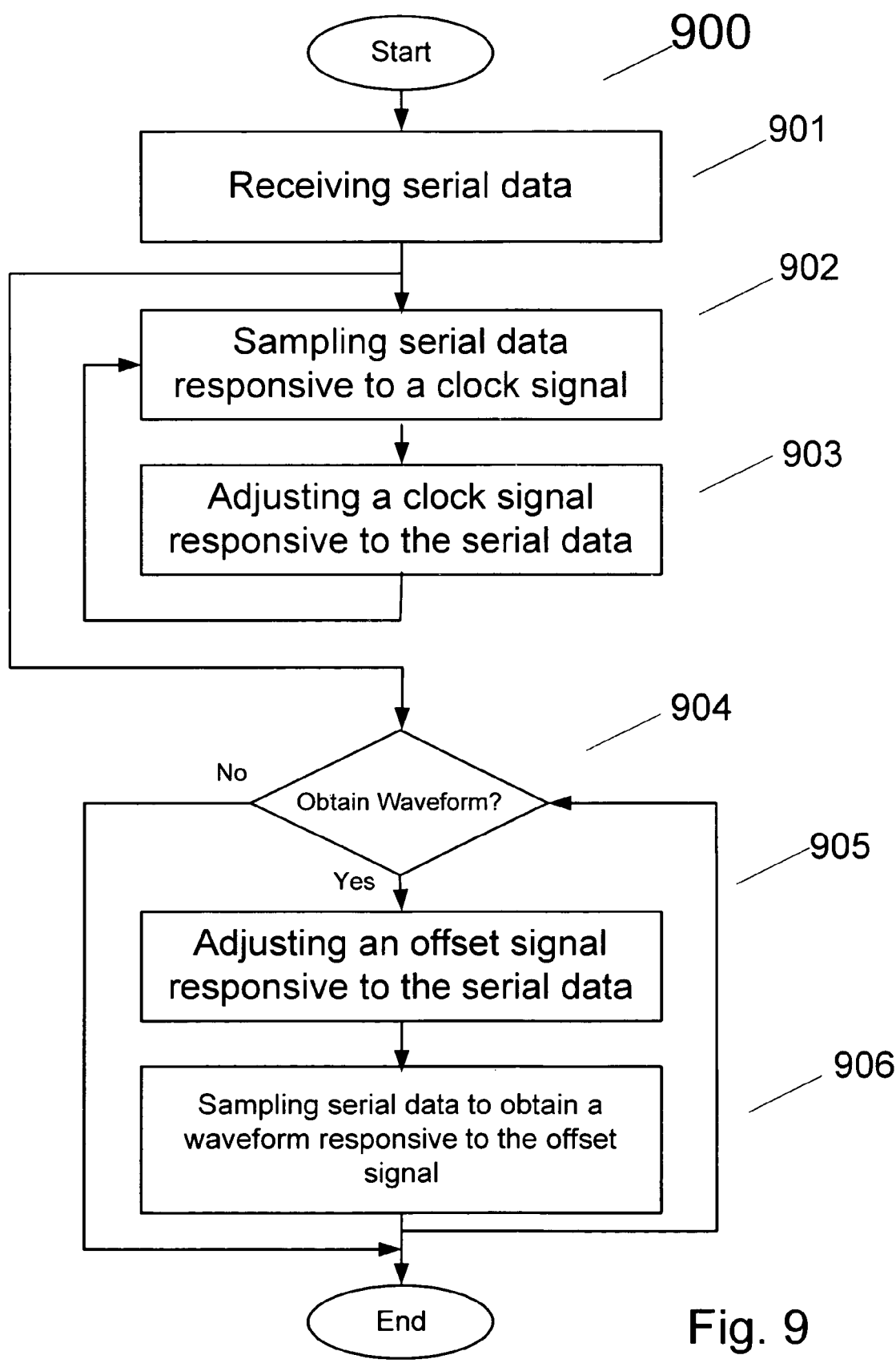
FIG. 9 is a flow chart of a method in accordance with an embodiment of the present invention.

FIG. 9 illustrates a method 900 according to an embodiment of the present invention. In alternate embodiments of the present invention, steps illustrated in FIG. 9 are carried out by hardware, software or a combination thereof. In alternate embodiments, the steps illustrated in FIG. 9 are carried out by the components illustrated in FIGS. 3-8. As one of ordinary skill in the art would appreciate, other steps that are not shown may be included in various embodiments of the present invention.

Method 900 begins at step 901 where serial data is received. Serial data is then sampled as illustrated by step 902. In an embodiment of the present invention, data/edge samplers 100, as illustrated in FIG. 3, may sample serial data. A sampling clock signal is then adjusted for sampling the incoming serial data in step 903. Steps 902 and 903 are repeated in order to synchronize or phase lock to the incoming serial data. In an embodiment of the present invention, an edge clock signal is adjusted and used for sampling serial data at half rate. In alternate embodiments, other clock signals are used for synchronization. A determination is made whether to capture a representation of a waveform of the incoming serial. If a representation of a waveform does not need to be captured, method 900 exits; otherwise an offset signal is adjusted in response to the serial data as illustrated by step 905. Step 906 then illustrates sampling serial data to obtain a representation of a waveform in response to the phase adjusted clock signal. Steps 905 and 906 are then repeated until a representation of a waveform is obtained.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A clock data recovery (CDR) circuit, comprising:
a plurality of samplers to receive a data signal;
a phase detector to output CDR tracking information based on information from at least one of the plurality of samplers; and
logic to receive the CDR tracking information and to adjust a phase of a first clock signal used by at least one of the plurality of samplers to sample the data signal, the logic switching between phase locking the first clock signal with the data signal and phase sweeping the first clock signal to allow the CDR circuit to capture a waveform of the data signal in response to a control signal.

2. The CDR circuit of claim 1, wherein the plurality of samplers includes at least one first sampler and the phase detector outputs the CDR tracking information based on information from the at least one first sampler.

3. The CDR circuit of claim 2, wherein the plurality of samplers includes at least one second sampler coupled to the logic to capture the waveform of the data signal.

4. The CDR circuit of claim 3, further comprising additional logic to adjust a phase of at least one second clock signal used by the at least one first sampler to sample the data signal.

5. The CDR circuit of claim 4, wherein the at least one second clock signal is independent of the first clock signal such that the at least one second clock signal continues to phase track the data signal while the first clock signal is phase-swept.

6. The CDR circuit of claim 4, wherein the at least one first sampler, the phase detector and the additional logic form at least part of a CDR loop and the CDR loop is not disengaged when the first clock signal is phase swept to allow the CDR circuit to capture the waveform of the data signal.

7. The CDR circuit of claim 1, wherein at least one of the plurality of samplers, the phase detector and the logic form at least part of a CDR loop and the CDR loop is disengaged when the logic is phase sweeping the first clock signal.

8. The CDR circuit of claim 1, wherein at least one of the plurality of samplers, the phase detector and the logic form at least part of a CDR loop and the CDR loop is not disengaged when the logic is phase sweeping the first clock signal.

9. The CDR circuit of claim 1, wherein the logic also adjusts a phase of a second clock signal used by another one of the plurality of samplers to sample the data signal, the logic keeping the second clock signal phase locked to the data signal while phase-sweeping the first clock signal.

10. The CDR circuit of claim 9, wherein the logic ignores information from the at least one sampler that uses the first clock signal to sampler data when the first clock signal is phase swept.

11. The CDR circuit of claim 9, wherein the another one of the plurality of samplers outputs edge information on even edges of the second clock signal and half-rate data information on odd edges of the second clock signal.

12. A method performed by a clock data recovery (CDR) circuit, comprising:
receiving a data signal at a plurality of samplers;
generating CDR tracking information based on information from at least one of the plurality of samplers;
phase tracking a first clock signal with the data signal based on the CDR tracking information in response to a control signal being de-asserted; and
phase sweeping the first clock signal to capture a waveform of the data signal in response to the control signal being asserted, the first clock signal being used to clock one of the plurality of samplers.

13. The method of claim 12, wherein the CDR tracking information is generated based on information from at least one first sampler.

14. The method of claim 13, wherein the waveform of the data signal is captured by at least one second sampler.

15. The method of claim 12, further comprising phase tracking a second clock signal with the data signal based on the CDR tracking information irrespective of whether the control signal is asserted, the second clock signal being used to clock at least one of the plurality of samplers.

16. The method of claim 15, wherein the CDR tracking information is generated from at least one sampler clocked by the second clock signal.

17. The method of claim 15, wherein the CDR tracking information is not based on information from any of the plurality of samplers clocked by the first clock signal when the control signal is asserted.

18. The method of claim 15, wherein the at least one of the plurality of samplers clocked by the second clock signal outputs edge information on even edges of the second clock signal and half-rate data information on odd edges of the second clock signal.

19. The method of claim 12, further comprising disengaging a CDR loop of the CDR circuit in response to the control signal being asserted.

20. The method of claim 12, further comprising keeping a CDR loop of the CDR circuit running when the first clock signal is phase-swept to capture the waveform of the data signal.

* * * * *